(12) United States Patent
Kazama

(10) Patent No.: US 8,767,424 B2
(45) Date of Patent: Jul. 1, 2014

(54) POWER CONVERSION APPARATUS WHICH PERFORMS POWER CONVERSION WITH SYNCHRONOUS RECTIFICATION

(75) Inventor: Shun Kazama, Osaka (JP)

(73) Assignee: Panasonic Corporation, Osaka (JP)

( * ) Notice: Subject to any disclaimer, the term of this patent is extended or adjusted under 35 U.S.C. 154(b) by 297 days.

(21) Appl. No.: 12/808,867

(22) PCT Filed: Dec. 19, 2008

(86) PCT No.: PCT/JP2008/003869
§ 371 (c)(1),
(2), (4) Date: Jun. 17, 2010

(87) PCT Pub. No.: WO2009/081561
PCT Pub. Date: Jul. 2, 2009

(65) Prior Publication Data
US 2011/0210713 A1    Sep. 1, 2011

(30) Foreign Application Priority Data
Dec. 20, 2007 (JP) ................. 2007-328148

(51) Int. Cl.
*H02M 7/537* (2006.01)

(52) U.S. Cl.
USPC ............... 363/131; 363/97; 363/132

(58) Field of Classification Search
USPC ............ 363/56.01–56.11, 95, 98, 131, 132
See application file for complete search history.

(56) References Cited

U.S. PATENT DOCUMENTS

| 5,123,746 A * | 6/1992 | Okado ............... 363/37 |
| 5,280,228 A * | 1/1994 | Kanouda et al. ............... 318/803 |
| 5,736,753 A | 4/1998 | Ohno et al. |
| 2003/0072117 A1* | 4/2003 | Maekawa et al. ............... 361/86 |
| 2003/0169611 A1* | 9/2003 | Nishizawa et al. ............ 363/132 |

(Continued)

FOREIGN PATENT DOCUMENTS

| JP | 7-131016 | 5/1995 |
| JP | 2000-23456 | 1/2000 |

(Continued)

OTHER PUBLICATIONS

International Search Report issued Mar. 17, 2009 in International (PCT) Application No. PCT/JP2008/003869.

(Continued)

*Primary Examiner* — Adolf Berhane
*Assistant Examiner* — Gustavo Rosario Benitez
(74) *Attorney, Agent, or Firm* — Wenderoth, Lind & Ponack, L.L.P.

(57) ABSTRACT

A power conversion apparatus includes a MOSFET having a channel and a body diode connected in parallel. The channel of the MOSFET becomes conductive according to a control signal, so that a flow path of a regenerative current of an inductor is formed, and the body diode of the MOSFET causes the regenerative current of the inductor to flow in a forward direction. The power conversion apparatus also includes a shunt resistor and a voltage measuring unit which measure an amount of a current flowing into the MOSFET. In addition, the power conversion apparatus includes a threshold designating unit which designates a threshold current amount, and a synchronous rectification prohibiting circuit which prohibits supplying the control signal when the amount of the current measured by the shunt resistor and the voltage measuring unit is greater than the threshold current amount designated by the threshold designating unit.

7 Claims, 12 Drawing Sheets

(56) References Cited

U.S. PATENT DOCUMENTS

| | | |
|---|---|---|
| 2004/0037099 A1 | 2/2004 | Nishikawa |
| 2005/0024097 A1* | 2/2005 | Sim et al. ............... 327/77 |
| 2005/0173739 A1 | 8/2005 | Kusumoto et al. |
| 2007/0086226 A1* | 4/2007 | Mavier et al. .......... 363/132 |
| 2007/0165431 A1* | 7/2007 | Gunji ....................... 363/98 |

FOREIGN PATENT DOCUMENTS

| | | |
|---|---|---|
| JP | 2000-350440 | 12/2000 |
| JP | 2002-291241 | 10/2002 |
| JP | 2004-32937 | 1/2004 |
| JP | 2004-96061 | 3/2004 |
| JP | 2007-312523 | 11/2007 |

OTHER PUBLICATIONS

A Reply (First) submitted in International Application No. PCT/JP2008/003869 and its English translation.

A Reply (Second) submitted in International Application No. PCT/JP2008/003869 and its English translation.

* cited by examiner

POWER CONVERSION APPARATUS WHICH PERFORMS POWER CONVERSION WITH SYNCHRONOUS RECTIFICATION

TECHNICAL FIELD

The present invention relates to power conversion apparatuses, and in particular, to a technique to achieve excellent power conversion efficiency on a power conversion apparatus.

BACKGROUND ART

Widely available are power conversion apparatuses (a converter and an inverter, for example) which obtain a regulated voltage or a regulated current by intermittently supplying power from a power source to an inductor. Such a power conversion apparatus typically employs a free-wheeling diode. A free-wheeling diode rectifies a regenerative current obtained by: a voltage generating coil provided in the power conversion apparatus; and an inductor which is a load coil provided out of the power conversion apparatus.

FIG. 11 is a circuit diagram exemplifying a conventional boost converter.

A boost converter 100 shown in FIG. 11 includes a low-side metal oxide semiconductor field effect transistor (MOSFET) 13, and a high-side MOSFET 12. The MOSFETs 12 and 13 are periodically and exclusively turned on by a gate signal provided from a controller 3.

The MOSFET 12 and the MOSFET 13 respectively include a body diode 12a and a body diode 13a which are parasitic in parallel between a drain and a source.

The MOSFET 13 intermittently supplies power from a power source 14 to an inductor 16 in response to the gate signal provided from the controller 3. This intermittent power supply adds a voltage of the power source 14 to a voltage generated by a counter electromotive force of the inductor 16 to generate an output voltage. The output voltage is supplied to a load 15.

The body diode 12a included in the MOSFET 12 serves as a free-wheeling diode in order to rectify the regenerative current of the inductor 16 (a current supplied to the load 15 in this example).

In general, however, a forward voltage characteristic of a body diode included in a MOSFET is poor. Specifically, an active region having a low current level sees on-resistance of the body diode higher than that of the MOSFET. Thus, as described above, the MOSFET 12 is turned on while the MOSFET 13 is off, and the regenerative current generated by the inductor 16 is supplied to a channel of the MOSFET 12. This technique reduces conduction loss caused at the MOSFET 12. Such a technique, referred to as synchronous rectification, has been widely utilized.

FIG. 12 exemplifies characteristic curves where the gate voltages (Vg) are 0V, +5V, and +10V. Here, each of the characteristic curves represents relationship between a drain current (Id) and a drain-source voltage (Vds) observed at a typical power MOSFET (hereinafter referred to as an Si-MOSFET). The MOSFET is made of silicon (Si) and includes a body diode.

When Vg is 0V, the channel shows no conduction, and a drain current flows into only the body diode. This results in describing a characteristic curve of the body diode. When Vg is +10V or greater, the channel is completely conductive, and the drain current flows into only the channel. This results in describing a characteristic curve of the channel. When Vg is +5V, described is a characteristic curve intermediate between the characteristic curve of the body diode and the characteristic curve of the channel.

Such characteristics of the Si-MOSFET have been commonly known. In the case of a power conversion apparatus handling a practical amount of a drain current (2A to 3A or below in characteristic shown in the graph in FIG. 12, for example) provided under a constraint such as heat release of an element, the power conversion apparatus in general synchronously rectifies the drain current and supplies the drain current to the channel. Compared with the technique of supplying the drain current to the body diode, this technique drops a drain-source voltage, and reduces the conduction loss observed at the Si-MOSFET.

Another technique prohibits the synchronous rectification in the case where the amount of a drain current is so small that drive loss exceeds drain-source conduction loss, the drive loss which represents power used for controlling synchronous rectification including transmission. This technique makes sure to reduce the overall loss of a power conversion apparatus and improves power conversion efficiency (See Patent Reference 1, for example).

Silicon carbide is an excellent semiconductor material applied to a power conversion apparatus. Compared with an Si-MOSFET, an MOSFET made of SiC (referred to as SiC-MOSFET, hereinafter) has preferable characteristics, such as high in rated voltage, quick in response speed, and stable in an operation under a high temperature.

The voltage drop occurring in a pn junction of SiC is approximately 2.5V. This is greater than the voltage drop occurring in that of Si; that is, 0.6V. Hence, when the drain current flows into only the body diode in the SiC-MOSFET, at least a voltage drop of 2.5V occurs between the drain and the source. This conduction loss is greater than a similar case occurred in the Si-MOSFET.

Thus, the synchronous rectification is more important for the power conversion apparatus using the SiC-MOSFET than for the power conversion apparatus using the Si-MOSFET in order to achieve excellent power conversion efficiency.

Patent Reference 1: Japanese Unexamined Patent Application Publication No. 2000-23456.

DISCLOSURE OF INVENTION

Problems that Invention is to Solve

The SiC-MOSFET is capable of stably operating under a temperature 100° C. or higher than a temperature under which the Si-MOSFET operates. Thus, the SiC-MOSFET possibly handles a greater amount of a drain current than the Si-MOSFET can handle even though both of the SiC-MOSFET and the Si-MOSFET share the same thermal design.

Furthermore, under a high temperature, a forward voltage of a body diode is generally known to drop as on-resistance of an MOSFET increases (in FIG. 12, the characteristic curves of the diode and the channel cross each other with the least amount of a drain current).

Thus, the power conversion apparatus using the SiC-MOSFET may practically handle a drain current of which amount is greater than a practical current amount observed in the power conversion apparatus using a conventional Si-MOSFET. Here, the amount of the drain current is so large that synchronously rectifying the drain current causes even further conduction loss. In such a case, synchronous rectification without thorough consideration results in a significant loss in power conversion efficiency due to an unnecessary drive loss, as well as an increase in conduction loss.

However, none of power conversion apparatuses, which synchronously rectifies such an amount of a current, has a preferable structure for achieving excellent power conversion.

The present invention is conceived in view of the above problems and has as an object to introduce a new structure for achieving excellent power conversion efficiency on a power conversion apparatus performing synchronous rectification.

Means to Solve the Problems

In order to solve the above problem, a power conversion apparatus according to an aspect of the present invention obtains either a regulated voltage or a regulated current by intermittently supplying power from a power source to an inductor. The power conversion apparatus according to the aspect of the present invention includes: a switching unit which includes a field-effect transistor representing a switching element and a diode connected in parallel, the switching element becoming conductive according to a control signal to be supplied, so that a flow path of a regenerative current of the inductor is formed, the diode having the regenerative current of the inductor flow in a forward direction, and the field-effect transistor being placed so that the regenerative current of the inductor flows from a source toward a drain on the field-effect transistor; a measuring unit which measures either an amount of a current flowing into the switching unit or a value of a voltage generated across the switching unit; a threshold designating unit which designates a threshold which is predetermined based on a comparison between (i) on-resistance of the switching element in the case where a current in a same amount flows through the switching element in the forward direction with respect to the diode and (ii) on-resistance of the diode in the case where a current in a same amount flows through the diode; and a prohibition control unit which prohibits supplying the control signal to the switching element in the case where either the amount of the current, or the amounts of the voltages measured by the measuring unit are greater than the threshold designated by the threshold designating unit.

The switching unit may include switching units connected in parallel and commonly controlled via the control signal, and the measuring unit may be connected to one of the switching units to measure a current flowing through the connected switching unit.

According to this structure, the power conversion apparatus according to the aspect of the present invention prohibits synchronous rectification when the amount of a flowing current is so great that on-resistance of a switching element becomes greater than that of a diode in the case where a regenerative current generated by an inductor is synchronously rectified at a switching unit having the switching element and the diode connected in parallel. This structure can provide the regenerative current to one of the switching element and the diode, whichever suffers less conduction loss, according to the amount of the flowing current. As a result, the aspect eliminates drive loss due to supply and transmission of a control signal used for synchronous rectification, as well as makes sure to reduce conduction loss, in synchronous rectification, caused at the switching unit, and thus makes possible achieving excellent power conversion efficiency on the power conversion apparatus.

The power conversion apparatus according to the aspect of the present invention may further include a temperature measuring unit which measures a temperature of said switching unit, wherein the threshold designating unit may designate amounts of threshold currents to respective different temperatures, and the prohibition control unit may prohibit supplying the control signal to the switching unit in the case where the amount of the current measured by the measuring unit is greater than an amount of a threshold current corresponding to the temperature measured by the temperature measuring unit, the threshold current being one of the threshold currents designated by the threshold designating unit.

According to the structure, when the threshold current changes depending on a temperature, the power conversion apparatus according to the aspect of the present invention prohibits synchronous rectification according to an appropriate threshold current values based on the temperature. Thus, this aspect makes possible achieving excellent power conversion efficiency on the power conversion apparatus across a wide temperature range.

At least one of the switching element and the diode may be made of silicon carbide.

According to the structure, the switching element and the diode which are made of Sic can operate under a high temperature. This may make possible practically handling a large amount of current such that the on-resistance of the switching element is greater than that of the diode. Hence, prohibition of synchronous rectification is technically significant in order to achieve excellent power conversion efficiency on the power conversion apparatus.

A power conversion apparatus according to an aspect of the present invention converts a direct current into an N-phase alternate current (N is an integer equal to 3 or greater), and supplies the converted N-phase alternate current to an inductor working as a load and provided for each phase. The power conversion apparatus according to the aspect of the present invention includes: 2N arms each including a switching unit having a field-effect transistor representing a switching element and a diode connected in parallel, the switching element becoming conductive according to a control signal to be supplied, so that a flow path of a regenerative current of the inductor is formed, said diode having the regenerative current of the inductor flow in a forward direction, and the field-effect transistor being placed so that the regenerative current of the inductor flows from a source toward a drain on the field-effect transistor; N legs each provided in a corresponding one of N-phases, formed with the 2N arms serially connected in a pair, having ends connected to a direct-current power source, and having a mid point connected to an inductor of the corresponding one of the N-phases; a load current determining unit which determines an amount of a current flowing into an inductor provided in each of the N-phases; a threshold designating unit which designates a threshold which is predetermined based on a comparison between (i) on-resistance of the switching element in the case where a current in a same amount flows through the switching element in the forward direction with respect to the diode and (ii) on-resistance of the diode in the case where a current in a same amount flows through the diode; and a prohibition control unit prohibits supplying the control signal to the switching element included in the leg of the corresponding N-phase, in the case where the amount of the current, for each of the N-phases, determined by the load current determining unit is greater than the threshold designated by the threshold designating unit.

It is noted that the present invention can be achieved as a method of controlling the power conversion apparatus, as well as the power conversion apparatus.

Effects of the Invention

As described above, a power conversion apparatus according to an implementation of the present invention prohibits synchronous rectification when the amount of a flowing current is so great that on-resistance of a switching element becomes greater than that of a diode in the case where a regenerative current generated by an inductor is synchronously rectified at a switching unit having the switching element and the diode connected in parallel. This structure can provide the regenerative current to one of the switching element and the diode, whichever suffers less conduction loss, according to the amount of the flowing current.

As a result, the implementation eliminates drive loss due to supply and transmission of a control signal used for synchronous rectification, as well as makes sure to reduce conduction loss caused at the switching unit, and thus makes possible achieving excellent power conversion efficiency on the power conversion apparatus.

NUMERICAL REFERENCES

Figure 1:
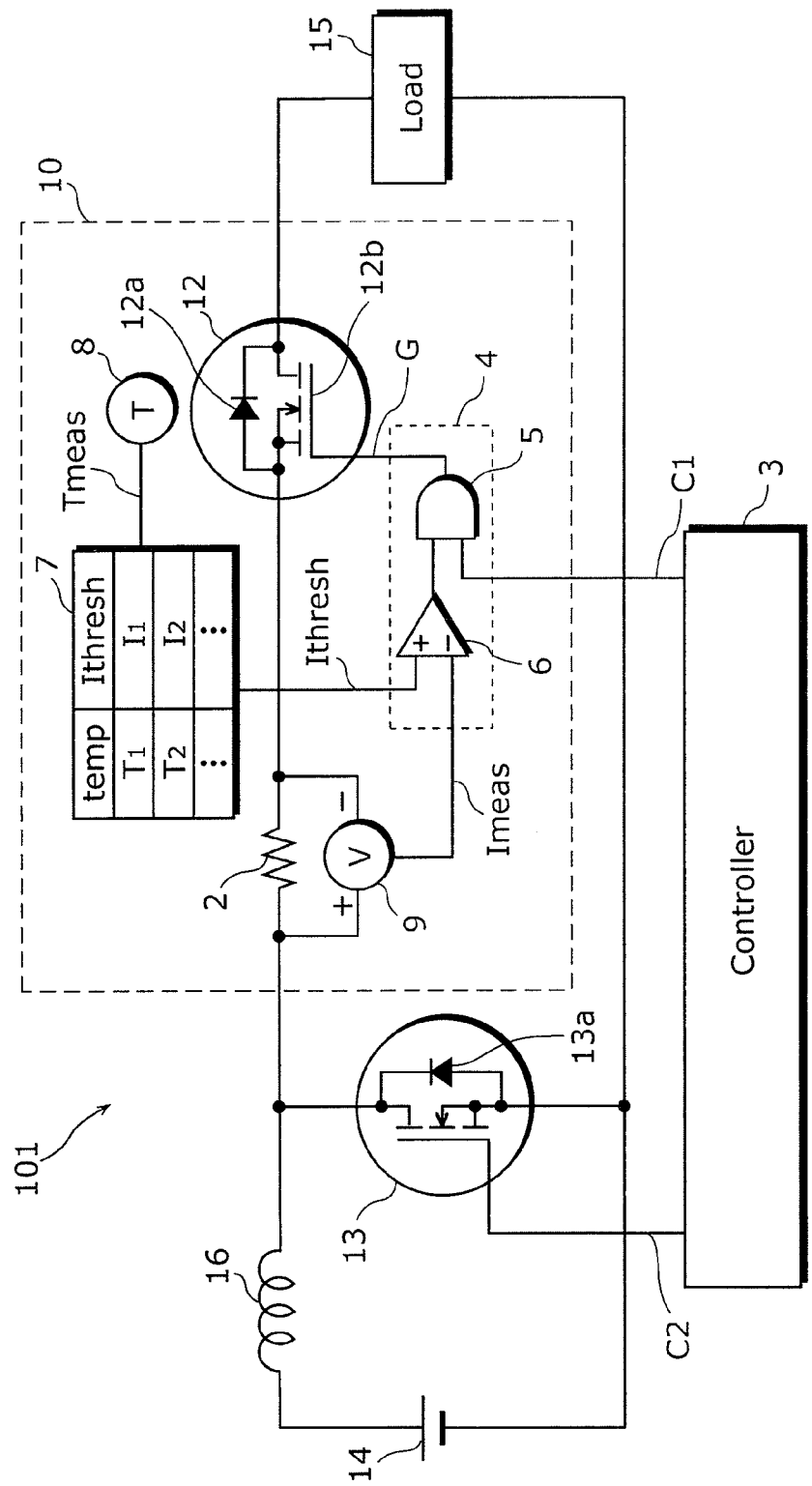
FIG. 1 is a functional block diagram exemplifying a structure of a boost converter in accordance with the present invention.

2 Shunt resistor
3 and 30 Controller
4 and 40 Synchronous rectification prohibiting circuit
5, and 51 to 56 AND gate
6, and 61 to 66 Comparator
7 and 21 Threshold designating unit
8 Temperature measuring unit
9 Voltage measuring unit
10, 10a to 10f, 20, and 22 Synchronous rectifying circuit
11 Intelligent Power Module (IPM)
12, 13, and 41 to 46 MOSFET
12a and 13a Body diode
12b Channel
14 Power source
15 Load
16 and 17 Inductor
18 Capacitor
19 Three-phase motor
19a to 19c Coil
31 to 33 Current measuring unit
34 to 37 Computing unit
100, 101, and 102 Boost converter
200 and 201 Buck converter
301 Full bridge inverter
401, 501, and 502 Three-phase inverter

BEST MODE FOR CARRYING OUT THE INVENTION

Described hereinafter are Embodiments of the present invention with reference to the drawings.

Embodiment 1

FIG. 1 is a functional block diagram exemplifying a structure of a boost converter 101 serving as a power conversion apparatus in accordance with Embodiment 1 of the present invention.

Similar to a conventional boost converter 100 (see FIG. 11 and Background Art), the boost converter 101 is a circuit to supply an output voltage to the load 15 with the MOSFETs 12 and 13 alternatively turning on according to control signals C1 and C2 periodically and exclusively supplied from the controller 3. Here, the output voltage is obtained by adding a voltage generated by the counter electromotive force of the inductor 16 to a voltage of the power source 14.

As a circuit used for synchronously rectifying the regenerative current of the inductor 16, the boost converter 101 has a synchronous rectifying circuit 10 instead of the MOSFET 12 found in the boost converter 100. The synchronous rectifying circuit 10, including the MOSFET 12, is capable of prohibiting synchronous rectification according to an amount of a drain current flowing into the MOSFET 12.

The structural elements other than the synchronous rectifying circuit 10 are identical to those in the boost converter 100, and thus, the description thereof shall be omitted. Chiefly detailed hereinafter is the synchronous rectifying circuit 10.

The synchronous rectifying circuit 10 includes the MOSFET 12, a shunt resistor 2, a voltage measuring unit 9, a temperature measuring unit 8, a threshold designating unit 7, and a synchronous rectification prohibiting circuit 4. The MOSFET 12 includes the body diode 12a and a channel 12b. The synchronous rectification prohibiting circuit 4 includes a comparator 6 and an AND gate 5.

Here, the MOSFET 12 including the channel 12b, the body diode 12a, and the MOSFET 12 including the body diode 12a respectively exemplify a switching element, a diode, and a switching unit according to implementations of the present invention. The shunt resistor 2 and the voltage measuring unit 9 exemplify a measuring unit according to an implementation of the present invention. The temperature measuring unit 8, the threshold designating unit 7, and the synchronous rectification prohibiting circuit 4 respectively exemplify a temperature measuring unit, a threshold designating unit, and a prohibition control unit according to implementations of the present invention.

The shunt resistor 2 is serially connected to the MOSFET 12. The voltage measuring unit 9 measures a voltage generated across the shunt resistor 2, and outputs the measurement result as an amount of a drain current of the MOSFET 12; namely, "Imeas".

It is noted that the amount of the drain current of the MOSFET 12 may be measured by any known technique, instead of using the shunt resistor 2 or the voltage measuring unit 9. For example, a converter may be provided on a line supplying the drain current of the MOSFET 12 to a load in order to measure an induced current caused by the drain current. A hole element may be provided near the line in order to measure a magnetic field caused by the drain current. Hence, each measurement result may be used to determine the amount of the drain current.

The temperature measuring unit 8 is provided inside or near the MOSFET 12. The temperature measuring unit 8 measures a temperature, and outputs the measurement result as a temperature value; namely "Tmeas", of the MOSFET 12.

The threshold designating unit 7 designates to the synchronous rectification prohibiting circuit 4 an amount of a threshold current; namely, "Ithresh". The "Ithresh" corresponds to the temperature value "Tmeas" obtained by the temperature measuring unit 8.

Figure 2:
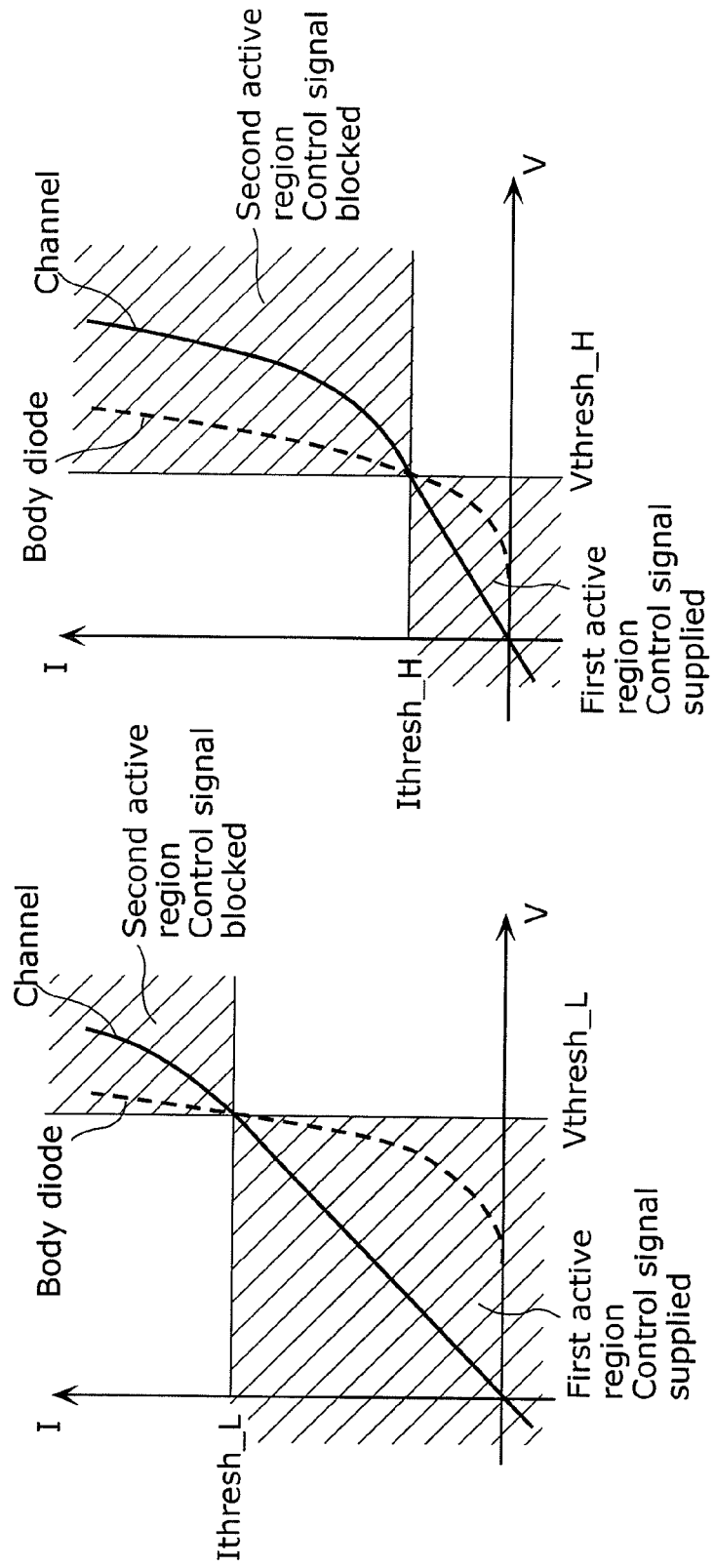
FIGS. 2A and 2B show an amount of a threshold current.

FIGS. 2A and 2B graphically show the amount of the threshold current "Ithresh" which the threshold designating unit 7 designates.

Similar to the graph shown in FIG. 13, the graphs in FIGS. 2A and 2B show characteristic curves describing a relationship between the drain current of the MOSFET 12 (ordinate) and a drain-source voltage (abscissa) in the case where (i) conduction is observed only in the channel 12b, and (ii) conduction is observed only in the body diode 12a. The graphs in FIGS. 2A and 2B respectively describe characteristic curves at normal temperature and high temperature.

A first active region in FIGS. 2A and 2B is an active region of the MOSFET 12. In the first active region, the conduction loss is smaller in flowing the current to the channel 12b than to the body diode 12a since the on-resistance of the channel 12b is smaller than that of the body diode 12a.

A second active region is an active region of the MOSFET 12. In the second active region, the conduction loss is smaller in flowing the current to the body diode 12a than to the channel 12b since the on-resistance of the channel 12b is greater than that of the body diode 12a.

The threshold designating unit 7 designates to the synchronous rectification prohibiting circuit 4 amounts of the threshold current "Ithresh" to respective different temperatures. The "Ithresh" has been predetermined based on a comparison between the on-resistance of the channel 12b and the on-resistance of the body diode 12a in the case where a current in a same amount flows.

Predetermined as the amount of the threshold current "Ithresh" is an amount of a drain current of the MOSFET 12. The drain current amount indicates a boundary between the first active region and the second active region for each temperature ("Ithresh_L" at normal temperature and "Ithresh_H" at high temperature).

The present invention shall not limit a concrete structure of the threshold designating unit 7. An implementation of the threshold designating unit 7 may be exemplified as below.

The threshold designating unit 7 may be, for example, implemented using a data table, an A/D (analogue-digital) converter, and a D/A (digital-analogue) converter. Here, the data table associates a temperature value with an amount of a threshold current, and stores the associated data in digital values.

The implementation involves (i) converting the temperature value "Tmeas" to a digital value by the A/D converter, and (ii) referring to the data table for a threshold corresponding to the digitized temperature value. Here, the "Tmeas" is obtained by the temperature measuring unit 8. Then, the referred threshold is converted to an analogue value by the D/A converter. The amount of the threshold current "Ithresh", which is expressed in an analogue value, is supplied to the comparator 6 included in the synchronous rectification prohibiting circuit 4.

In addition, the threshold designating unit 7 may be implemented, for example, as an analogue circuit which (i) classifies temperature values "Tmeas" into stages, (ii) generates voltage signals each representing an amount of a threshold current "Ithresh" corresponding to the result of the classification, and (iii) supplies the generated voltage signals to the comparator 6 included in the synchronous rectification prohibiting circuit 4.

As described later, when the MOSFET 12 is in the first active region according to an amount of a drain current to be measured, the control signal C1 is supplied to the MOSFET 12 as a gate signal "G". When the MOSFET 12 is in the second active region according to an amount of a drain current to be measured, the control signal C1 is blocked.

FIGS. 2A and 2B show that the boundary between the first and the second active regions may also be expressed in a threshold regarding a drain-source voltage of the MOSFET 12. Described later is a modification involving designating the drain-source voltage of the MOSFET 12 ("Vthresh_L" at normal temperature and "Vthresh_H" at high temperature) as a threshold voltage value "Vthresh". Here, the drain-source voltage indicates the boundary between the first and the second active regions.

With reference to FIG. 1 again, the comparator 6 included in the synchronous rectification prohibiting circuit 4 outputs a comparison result found between (i) the amount of the threshold current "Ithresh" obtained from the threshold designating unit 7, and (ii) the amount of the drain current of the MOSFET 12 "Imeas" obtained from the voltage measuring unit 9.

When an output from the comparator 6 is a positive value; that is the amount of the drain current of the MOSFET 12 "Imeas" is smaller than that of the threshold current "Ithresh", the AND gate 5 outputs the control signal C1 provided from the controller 3 as the gate signal "G" of the MOSFET 12. When an output of the comparator 6 is a negative value; that is the amount of the drain current of the MOSFET 12 "Imeas" is greater than that of threshold current "Ithresh", the synchronous rectification prohibiting circuit 4 blocks the control signal C1 provided from the controller 3 to prohibit the MOSFET 12 from executing synchronous rectification.

Described next is a main operation of the above-structured boost converter 101.

Figure 3:
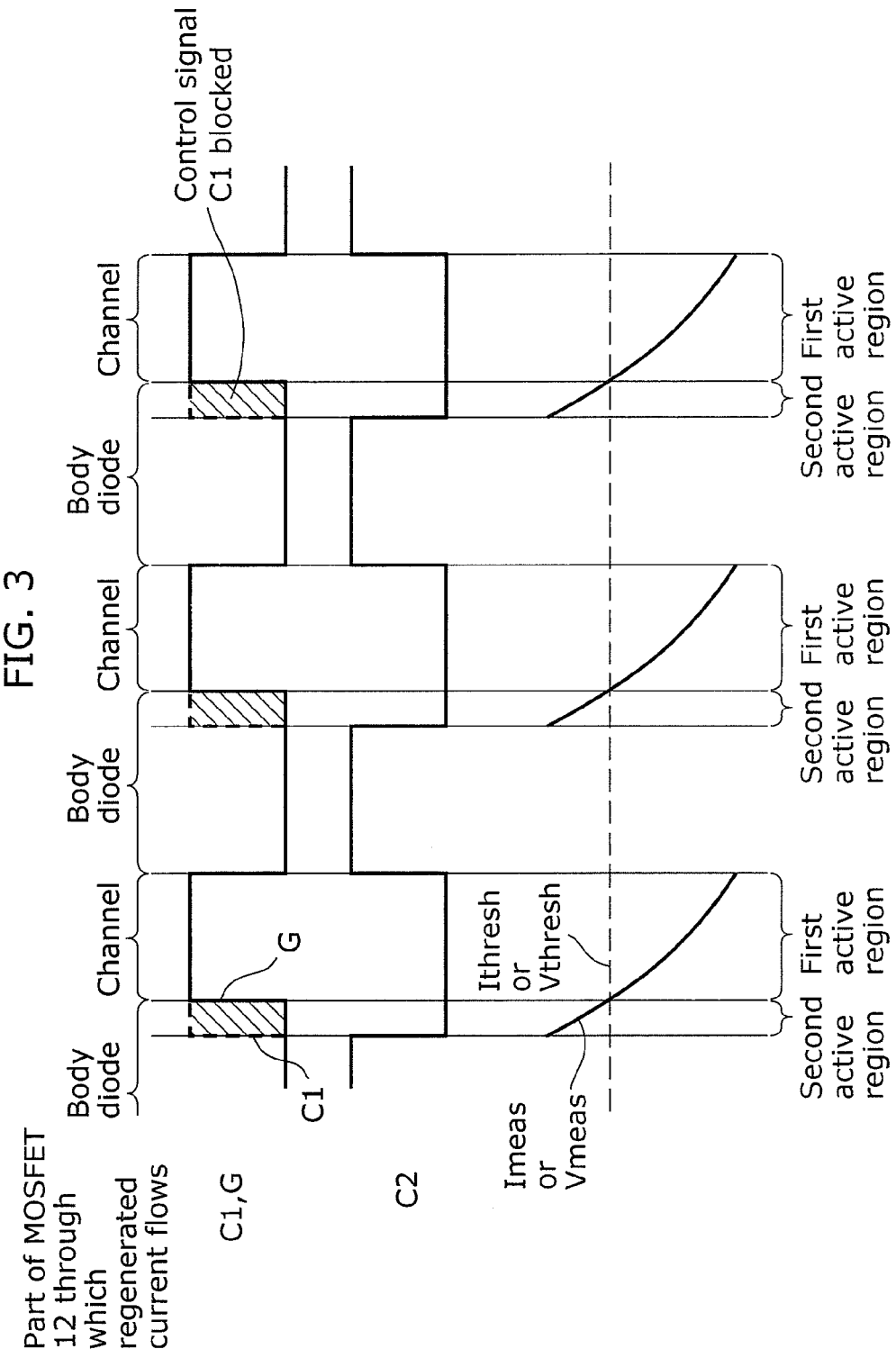
FIG. 3 is a timing chart showing major signals observed in the boost converter.

FIG. 3 is a timing chart showing major signals observed in the boost converter 101.

The controller 3 periodically and exclusively provides the control signals C1 and C2.

A typical period for providing the control signals C1 and C2 is changed based on a feedback control in order to supply to the load 15 a regulated voltage value or a regulated current amount. Such control is a known art and out of the subject matter of the present invention. Thus details thereof shall be omitted.

During a period in which the control signal C2 is being provided and the control signal C1 is being blocked, the MOSFET 13 is kept on. Accordingly, the amount of a current flowing from the power source 14 to the inductor 16 is gradually increasing. It is noted that FIG. 3 does not show the amount of the drain current of the MOSFET 12 "Imeas" during the period.

During a period in which the control signal C2 is being blocked and the control signal C1 is being provided, the regenerative current of the inductor 16 flows from the MOSFET 12 to the load 15. The amount of the regenerative current is measured as the amount of the drain current of the MOSFET 12 "Imeas".

Here, while the current amount "Imeas" is in the second active region and greater than the amount of threshold current "Ithresh", the synchronous rectification prohibiting circuit 4 blocks the control signal C1. As a result, no conduction is observed at the channel 12b of the MOSFET 12, and thus the regenerative current flows into the body diode 12a.

When the amount of the regenerative current decreases, the current amount "Imeas" becomes smaller than the threshold current amount "Ithresh" and is found in the first active region. Then, the synchronous rectification prohibiting circuit 4 supplies the control signal C1 to the MOSFET 12 as the gate signal "G". As a result, conduction is observed at the channel 12b of the MOSFET 12, and the regenerative current flows into the channel 12b.

The switching between a supply and a block of the control signal C1 is nearly instantly executed, following the change of the current amount "Imeas". Thus, the synchronous rectification prohibiting circuit 4 can instantly switch a flow path of the regenerative current to either the channel 12b or the body diode 12a, whichever has a smaller conduction loss, even in a single period of the control signal C1.

This structure allows the conduction loss of the MOSFET 12 to be minimized, and achieves excellent power conversion efficiency on the boost converter 101.

Furthermore, in the case where the load 15 is heavy and the frequency of the control signal C1 is significantly high, the regenerative current amount of the inductor 16 is always greater than the threshold current amount, and thus found in the second active region throughout periods in which plural pulses of the control signals C1 are provided. Under such a situation, the synchronous rectification prohibiting circuit 4 continues to block the control signal C1.

The continuous block leads to elimination of a drive loss which represents a power to be used for supplying and transmitting the control signal C1 to the MOSFET 12. This helps achieve excellent power conversion efficiency on the boost converter 101.

The threshold designating unit 7 may designate a threshold current amount which is great enough to compensate a drive loss. In other words, even though the prohibition of the synchronous rectification cannot improve the conduction loss, the synchronous rectification may still be prohibited in the case where the elimination of the drive loss results in an improvement in overall efficiency on the power conversion apparatus. Hence, the threshold designating unit 7 may designate, as the threshold current amount, a current amount obtained by subtracting (i) a current amount as much as the drive loss from (ii) the threshold current amount described in Embodiment 1.

Described next is a modification involving execution of prohibition control of the synchronous rectification according to a comparison between drain-source voltage thresholds of the MOSFET 12.

Figure 4:
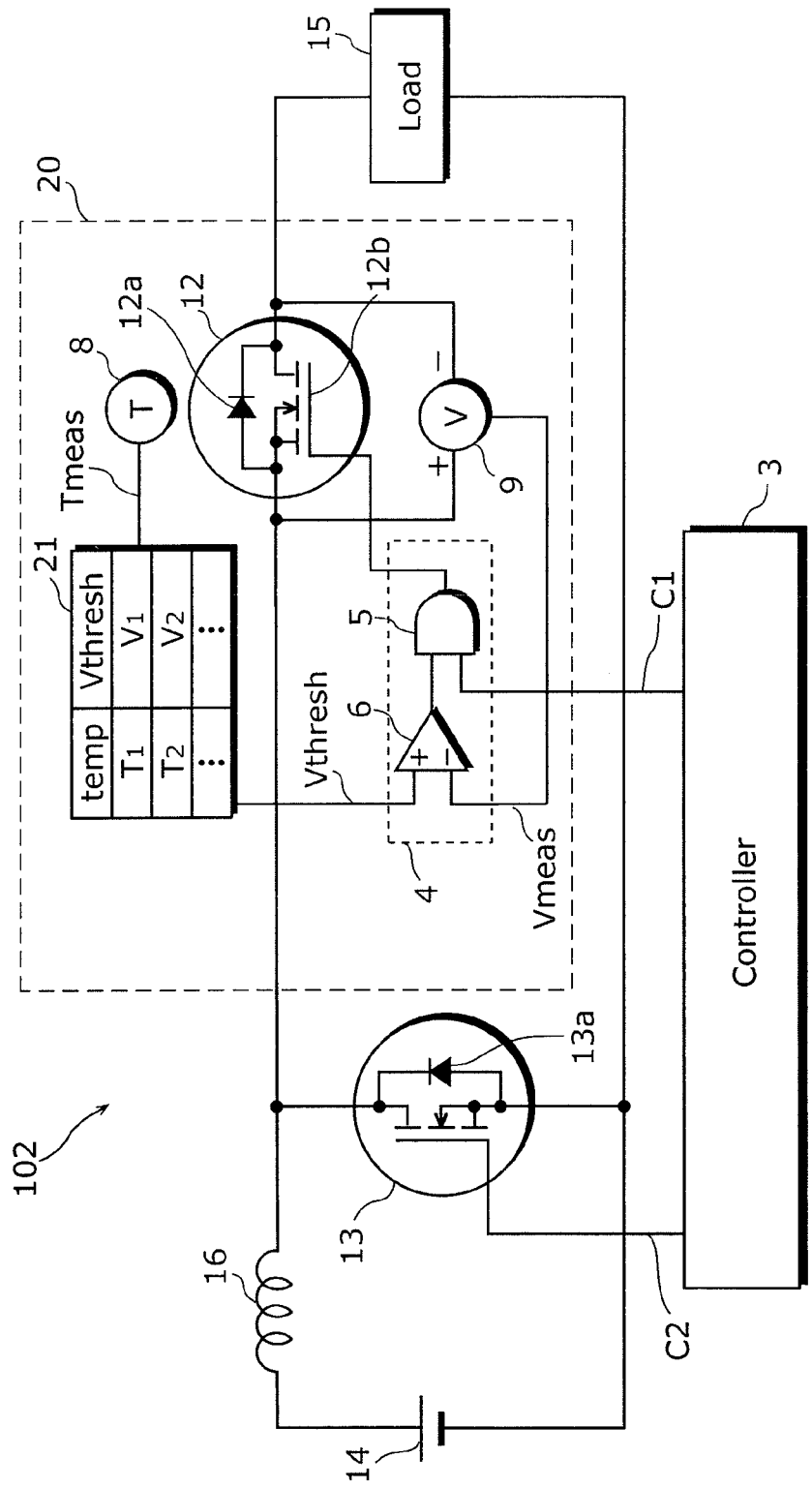
FIG. 4 is a functional block diagram exemplifying another structure of the boost converter in accordance with the present invention.

FIG. 4 is a functional block diagram exemplifying a structure of a boost converter 102 serving as the power conversion apparatus in accordance with a modification of Embodiment 1 of the present invention.

On a synchronous rectification circuit 20 in the boost converter 102, the voltage measuring unit 9 is connected to the MOSFET 12 in parallel. The voltage measuring unit 9 measures a drain-source voltage of the MOSFET 12, and outputs the measured value as a "Vmeas".

A threshold designating unit 21 designates to the synchronous rectification prohibiting circuit 4 the threshold voltage value; namely, "Vthresh". The "Vthresh" corresponds to the temperature value "Tmeas" obtained by the temperature measuring unit 8.

Predetermined as the threshold voltage value "Vthresh" is a drain voltage value of the MOSFET 12. The drain voltage value indicates a boundary between the first active region and the second active region for each temperature ("Vthresh_L" at normal temperature and "Vthresh_H" at high temperature), as shown in FIGS. 2A and 2B for example.

The comparator 6 included in the synchronous rectification prohibiting circuit 4 outputs a comparison result found between (i) the threshold voltage value "Vthresh" obtained from the threshold designating unit 21, and (ii) the drain-source voltage value of the MOSFET 12 "Vmeas" obtained from the voltage measuring unit 9.

When an output from the comparator 6 is a positive value; that is the drain-source voltage value of the MOSFET 12 "Vmeas" is smaller than the threshold voltage value "Vthresh", the AND gate 5 outputs the control signal C1 provided from the controller 3 as the gate signal "G" of the MOSFET 12. When an output of the comparator 6 is a negative value; that is the drain-source voltage of the MOSFET 12 is greater than the threshold voltage value "Vthresh", the synchronous rectification prohibiting circuit 4 blocks the control signal C1 provided from the controller 3 to prohibit the MOSFET 12 from executing synchronous rectification.

The boost converter 102 structured above executes the operation described in FIG. 3 based on the comparison between the voltage value "Vmeas" and the threshold voltage value "Vthresh". As a result, the flow of the drain current into the body diode 12a prohibits synchronous rectification in the second active region which can reduce the conduction loss of the MOSFET 12, as observed in the boost converter 101.

This structure allows the conduction loss of the MOSFET 12 to be minimized, and achieves excellent power conversion efficiency on the boost converter 102.

Unlike the boost converter 101, the boost converter 102 uses no shunt resistors used for detecting a drain current. This can avoid increase in the number of parts and a loss of a circuit.

As the timing chart in FIG. 3 indicates, the synchronous rectifying circuit 10 can autonomously execute synchronous rectification employed for achieving excellent power conversion efficiency by simply receiving the control signal C1 typically supplied to the MOSFET 12. In other words, the compatibility of the control signal C1 allows the synchronous rectifying circuit 10 to replace the MOSFET 12 without changing the controller 3, the MOSFET 12 which has executed the synchronous rectification alone.

Such compatibility is observed in the synchronous rectification circuit 20 in a similar manner.

In other words, the synchronous rectifying circuits 10 and 20 can be widely used instead of a MOSFET executing synchronous rectification in various power conversion apparatuses other than boost converters. The use of the synchronous rectifying circuits 10 and 20 can achieve excellent power conversion efficiency.

Described below is another modification of the power conversion apparatus including the synchronous rectifying circuit 10.

(Modification of Embodiment 1)

Described next is a buck converter exemplified as the power conversion apparatus in accordance with the present invention.

Figure 5:
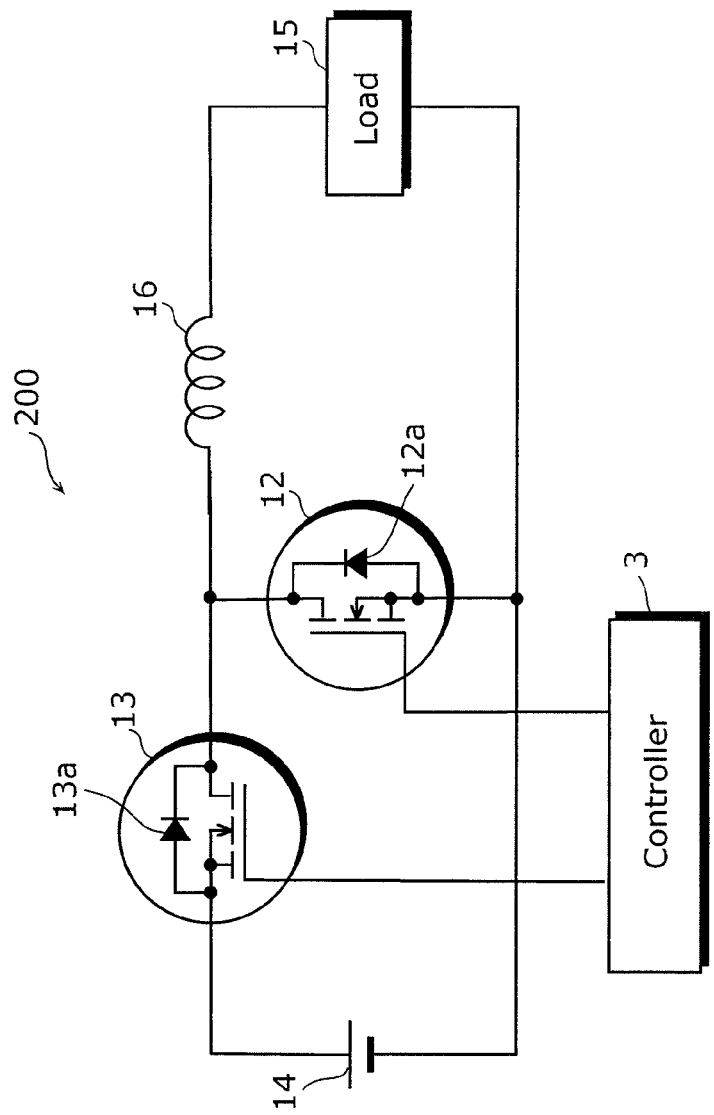
FIG. 5 is a circuit diagram exemplifying a conventional buck converter.

FIG. 5 is a circuit diagram exemplifying a conventional buck converter.

Figure 11:
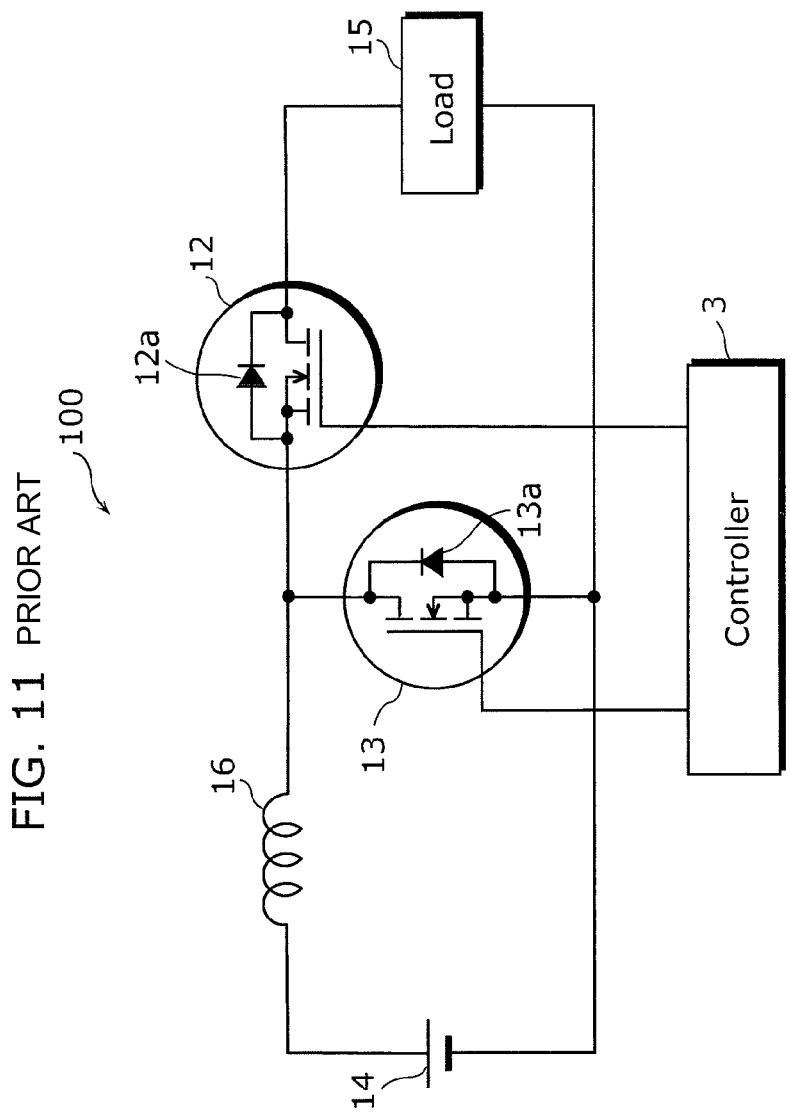
FIG. 11 is a circuit diagram exemplifying a conventional boost converter.
Figure 12:
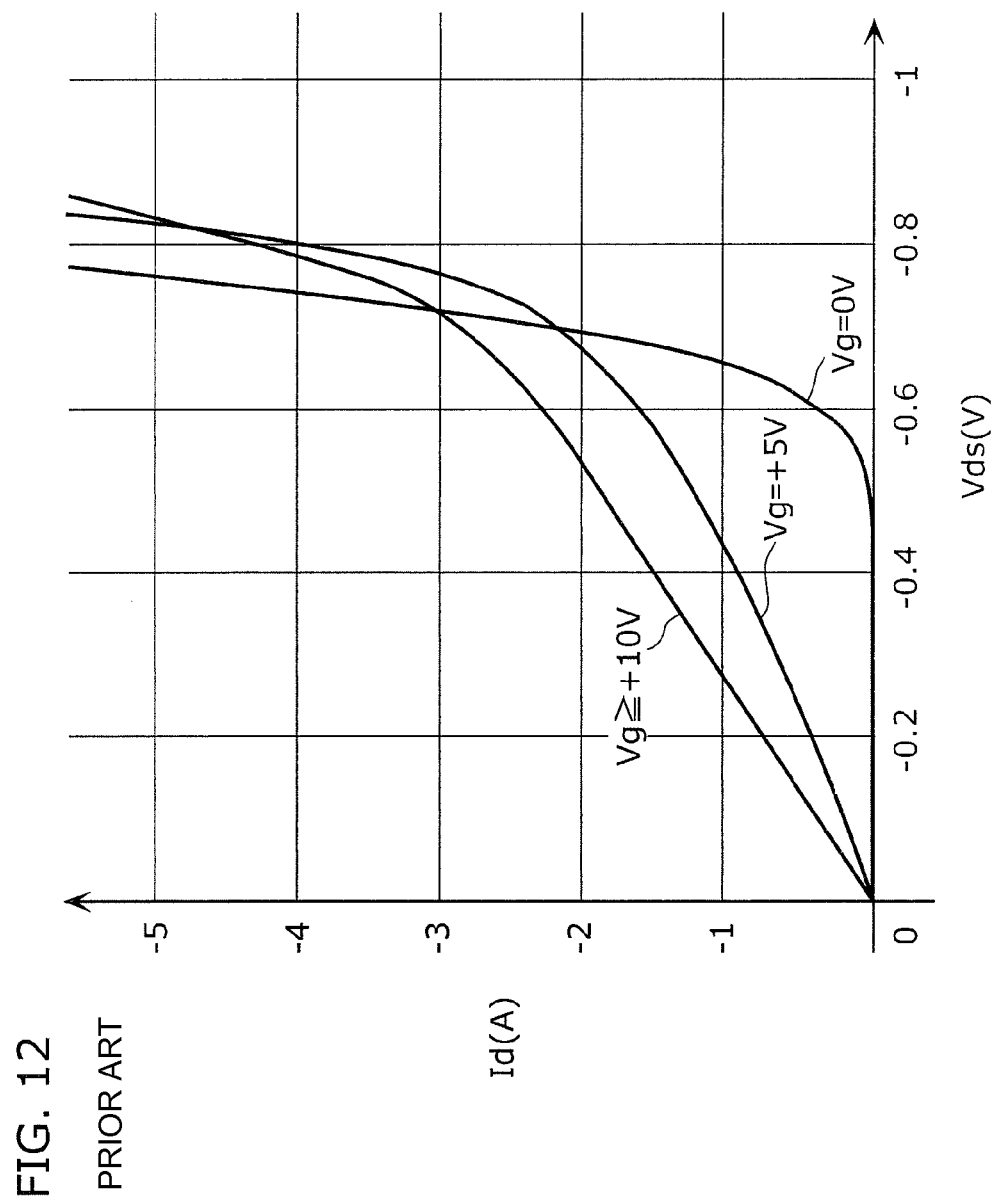
FIG. 12 graphically exemplifies a characteristic curve of a typical silicon power MOSFET.

A buck converter 200 shown in FIG. 5 is the boost converter 100 shown in FIG. 11 with the power source 14 and the load 15 replaced.

The buck converter serving as a power conversion apparatus in accordance with the present invention is built with the MOSFET 12, included in the buck converter 200, replaced with the synchronous rectifying circuit 10 described in Embodiment 1.

Figure 6:
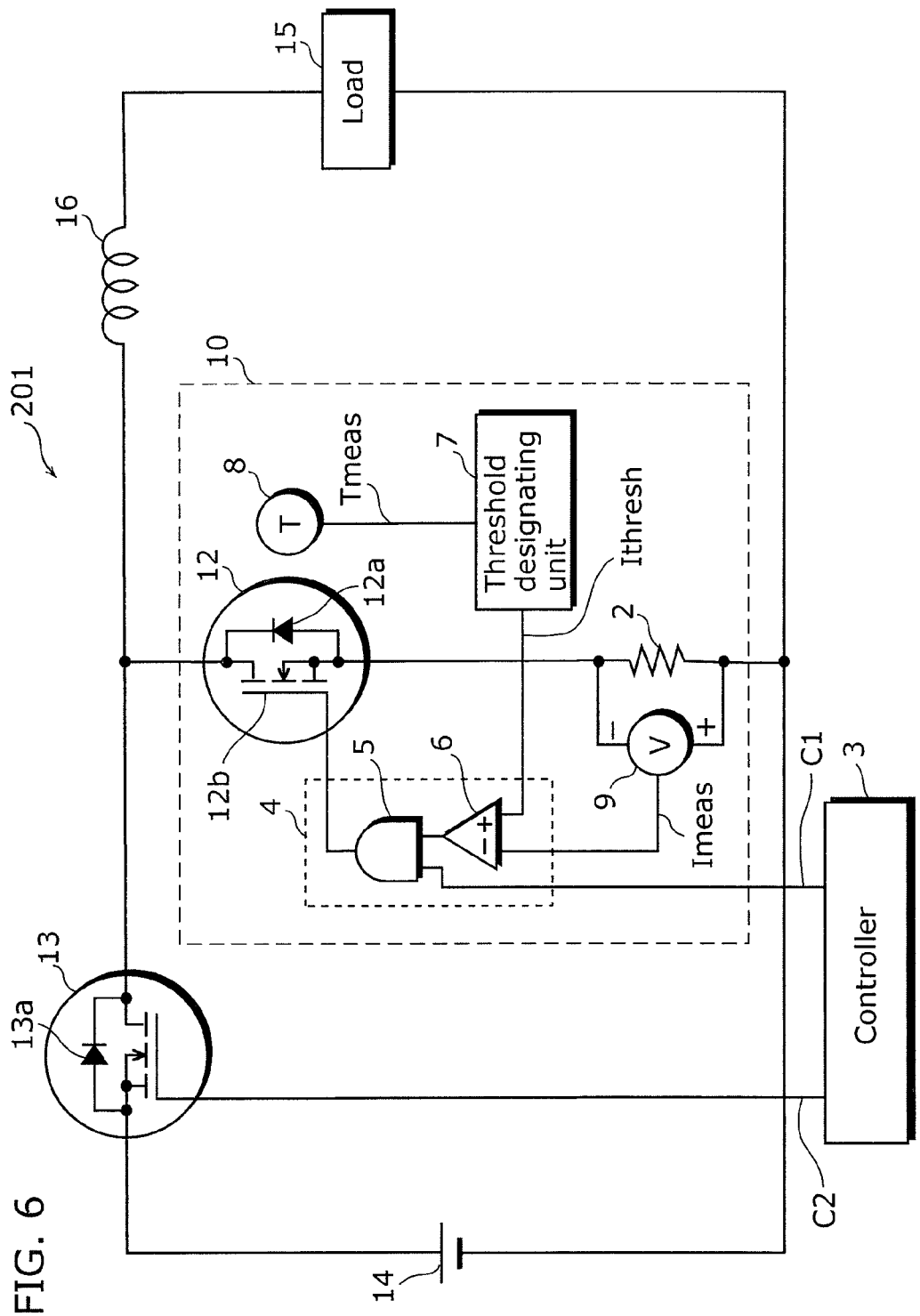
FIG. 6 is a functional block diagram exemplifying a structure of a buck converter in accordance with the present invention.

FIG. 6 is a functional block diagram exemplifying a structure of a buck converter 201 serving as a power conversion apparatus in accordance with Embodiment 1 of the present invention.

In the buck converter 201, the synchronous rectifying circuit 10 operates in a same manner as so in the boost converter 101. Thus, the synchronous rectifying circuit 10 can autonomously execute synchronous rectification employed for achieving excellent power conversion efficiency.

The structure of the buck converter 201 is applied to the case where the load 15 regeneratively charges the power source 14 in the boost converter 101. In the regenerative charge, the roles of the load 15 and the power source 14 reverse. Thus, the boost converter 101 works as a circuit equivalent to the buck converter 201. Specifically, in the regenerative charge, the MOSFET 13 shown in FIG. 1 synchronously rectifies the regenerative current of the inductor 16.

Hence, the MOSFET 13 in the boost converter 101 is replaced with another synchronous rectifying circuit 10 which is different from the synchronous rectifying circuit 10 including the MOSFET 12. In the case where the load 15 regeneratively charges the power source 14 in the boost converter 101, this structure allows the synchronous rectifying circuit 10, replaced with the MOSFET 13, to autonomously execute synchronous rectification employed for achieving excellent power conversion efficiency.

In other words, a boost converter, having both of the low-side MOSFET and the high-side MOSFET replaced with the synchronous rectifying circuits 10, is included in the present invention.

(Embodiment 2)

Described as Embodiment 2 is a modification of a synchronous rectification circuit including MOSFETs.

Figure 7:
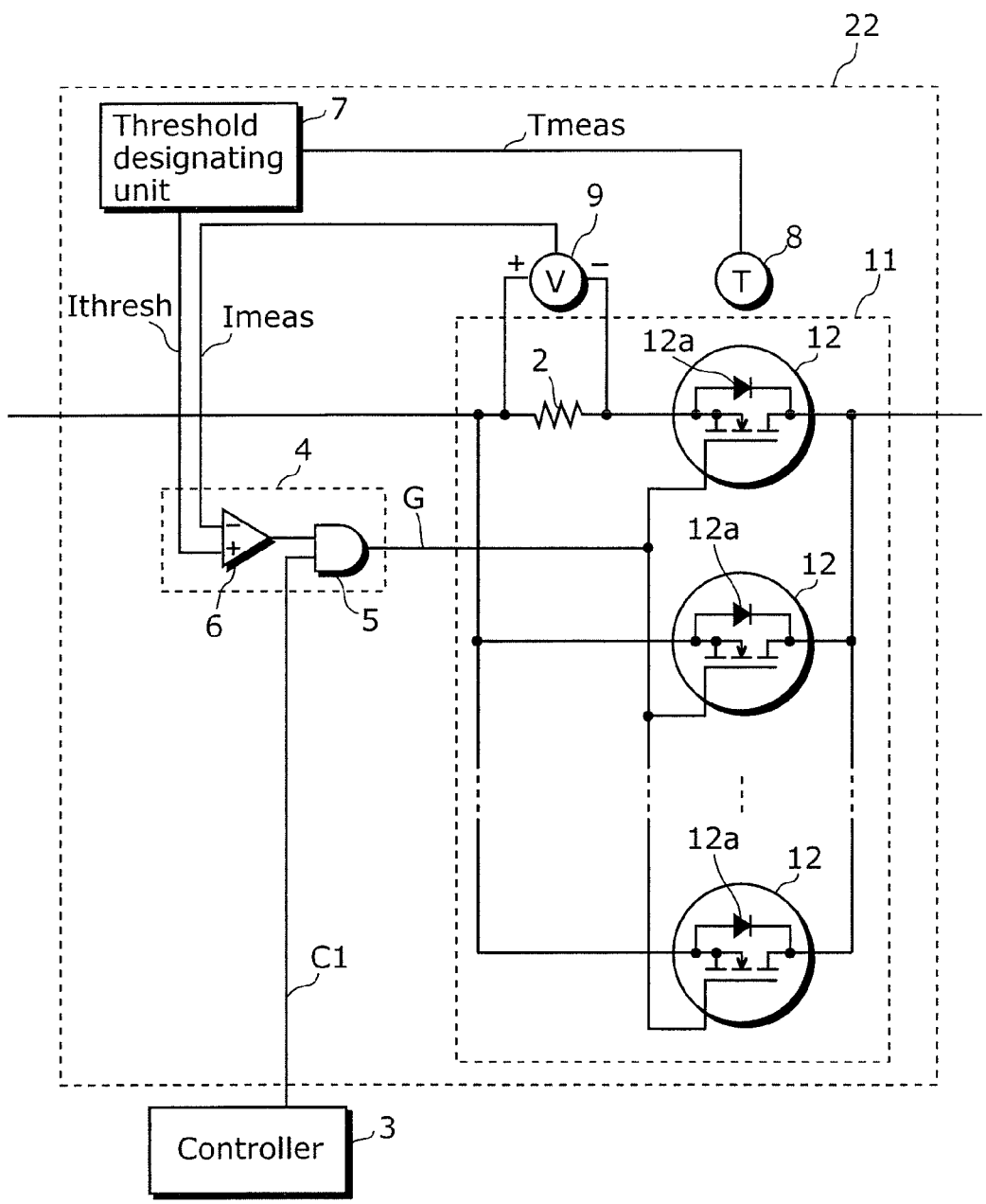
FIG. 7 is a functional block diagram exemplifying a structure of a synchronous rectifying circuit in accordance with the present invention.

FIG. 7 is a functional block diagram exemplifying a structure of a synchronous rectifying circuit 22 in accordance with Embodiment 2 of the present invention. The synchronous rectification circuit 22 is different from the synchronous rectifying circuit 10 shown in FIG. 1 in having (i) the MOSFETs 12 connected in parallel and commonly controlled via the gate signal "G", and (ii) the shunt resistor 2 connected in series only to a single representative MOSFET (the MOSFET 12 placed on the top in FIG. 7) among the MOSFETs 12.

Having the MOSFETs 12 connected in parallel, the synchronous rectification circuit 22 is suitable for handling a large amount of current. The MOSFETs 12 and the shunt resistor 2 included in the synchronous rectification circuit 22 may be contained in one package and formed into an IPM 11.

The synchronous rectification circuit 22 structured above operates in a same manner as the synchronous rectifying circuit 10 described in Embodiment 1 operates. Thus, the synchronous rectification circuit 22 can autonomously execute synchronous rectification employed for achieving excellent power conversion efficiency.

Instead of building shunt resistors into respective MOSFETs 12, the synchronous rectification circuit 22 has the shunt resistor 2 connected only to the single representative MOSFET in series in order to measure a drain current of the representative MOSFET as a sample. Thus, the synchronous rectification circuit 22 is formed in a simpler structure.

(Embodiment 3)

Described next are a full bridge inverter and a three-phase inverter exemplified as a power conversion apparatus in accordance with the present invention.

Figure 8A:
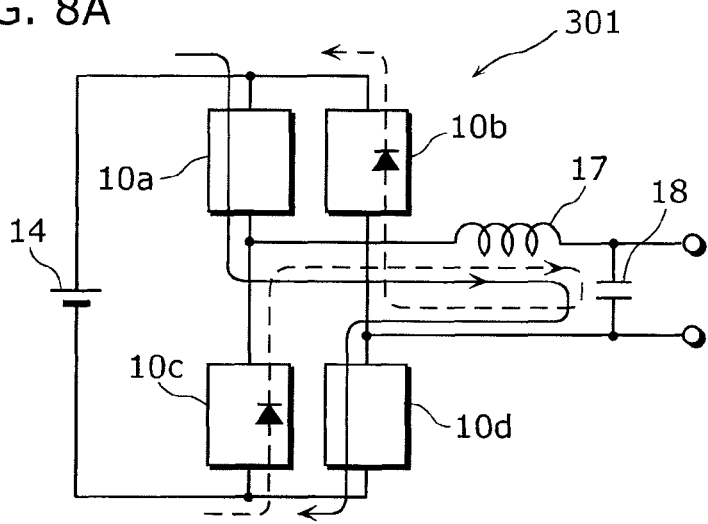
FIG. 8A is a functional block diagram exemplifying a structure of a full bridge inverter serving as the power conversion apparatus in accordance with the present invention.

FIG. 8A is a functional block diagram exemplifying a structure of a full bridge inverter 301 serving as a power conversion apparatus in accordance with Embodiment 3 of the present invention.

The full bridge inverter 301 has four switching elements replaced with respective four synchronous rectifying circuits 10, including the synchronous rectifying circuit 10 described above. Such switching elements are included in a bridge circuit of a typical full bridge inverter. Each of the synchronous rectifying circuits 10 is referred to as synchronous rectifying circuits 10a to 10d to be distinguished each other. The full bridge inverter 301 includes an inductor 17 and a capacitor 18 both used for smoothing.

The pairs of the synchronous rectifying circuits 10a and 10d, and the synchronous rectifying circuits 10b and 10c periodically and exclusively turn on via a known control signal (not shown). This turn-on causes the full bridge inverter 301 to convert direct-current power of the power 14 into alternating-current power. An operation of switching between the pairs of the synchronous rectification circuits to turn on is generally referred to as commutation.

Assume in FIG. 8A that a current, whose direction is shown in a solid line, flows into the inductor 17 immediately before the commutation from (i) the on-state of the pair of the synchronous rectifying circuits 10a and 10d to (ii) the on-state of the pair of the synchronous rectifying circuits 10b and 10c. Here, the regenerative current flowing into the inductor 17 continues to flow in a direction shown in a dotted line.

The regenerative current flowing in the direction can flow into both of a channel and a body diode of a MOSFET included in each of the synchronous rectifying circuits 10b and 10c. When the load is heavy, the regenerative current is expected to be a significantly great in amount.

The synchronous rectifying circuits 10b and 10c block the control signal to prohibit the channel of the MOSFET from turning on in the case where an amount of the regenerative current is observed in the second active region (flowing the regenerative current into the body diodes can further reduce the conduction loss than flowing the regenerative current into the channels of the MOSFETs). This operation of the synchronous rectifying circuits 10b and 10c is similar to that of the synchronous rectifying circuit 10 described in Embodiment 1. This operation causes the regenerative current to flow into the body diode.

When the amount of the regenerative current decreases to be observed in the first active region, the synchronous rectifying circuits 10b and 10c cancel the block of the control signal, and turn on the channels of the MOSFETs. This operation causes the regenerative current to flow into the channels.

As described above, the synchronous rectifying circuits 10b and 10c flow the regenerative current to either the channels or the body diodes of the MOSFETs, whichever have a smaller conduction loss, in order to improve the power conversion efficiency of the full bridge inverter 301.

Immediately after the commutation from (i) the on-state of the pair of the synchronous rectifying circuits 10b and 10c to (ii) the on-state of the pair of the synchronous rectifying circuits 10a and 10d, the synchronous rectifying circuits 10a and 10d operate as the synchronous rectifying circuits 10b and 10c operate. This operation improves the power conversion efficiency of the full bridge inverter 301.

The synchronous rectifying circuit 10 may as well be employed fin a three-phase inverter, as well as in a full bridge inverter, for example. This can improve power conversion efficiency of the three-phase inverter.

Figure 8B:
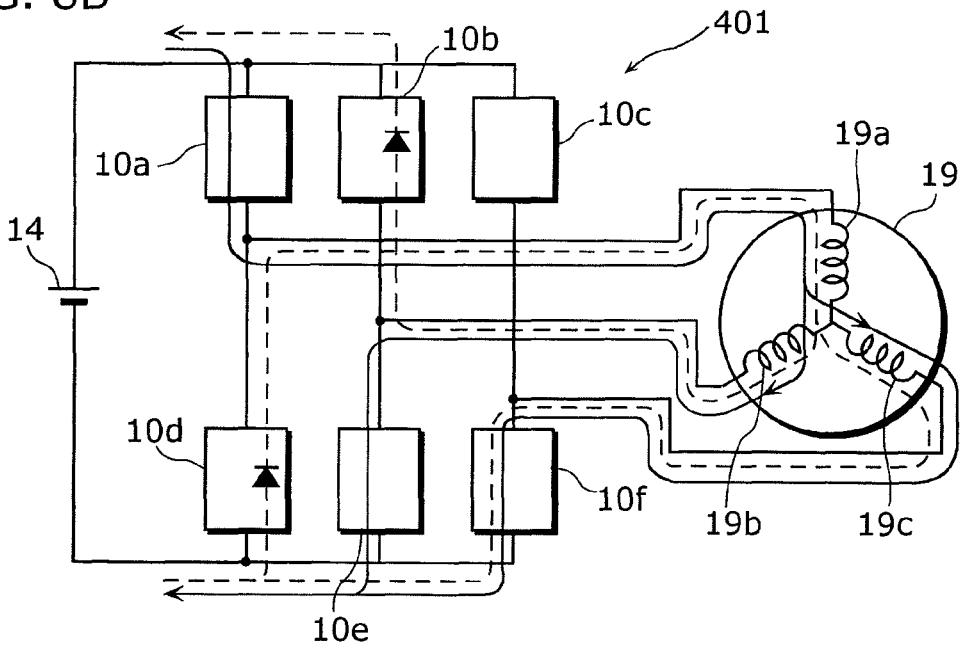
FIG. 8B is a functional block diagram exemplifying a structure of a three-phase inverter serving as the power conversion apparatus in accordance with the present invention.

FIG. 8B is a functional block diagram exemplifying a structure of a three-phase inverter 401 serving as a power conversion apparatus in accordance with Embodiment 3 of the present invention.

The three-phase inverter 401 is structured to have six switching elements replaced with the synchronous rectifying circuits 10. Such switching elements are included in a bridge circuit of a typical three-phase inverter.

The three-phase inverter 401 drives coils 19a to 19c located in respective phases and included in a three-phase motor 19. For the sake of convenience, a phase, referred to as a first phase, involves turning on the synchronous rectifying circuits 10a, 10e, and 10f to intend to flow currents to the coil 19a. Here, the currents flow to the center of the three-phase motor 19 illustrated in FIG. 8B. Another phase, referred to as a second phase, involves turning on the synchronous rectifying circuits 10b, 10d, and 10f to intend to flow currents to the coil 19b. Here, the currents flow to the center of the three-phase motor 19 illustrated in FIG. 8B.

Assume in FIG. 8B that currents, whose direction is shown in a solid line, flow from the first phase to the second phase immediately before the commutation. Here, immediately after the commutation, regenerative currents of the coils 10a to 19c flow in a direction shown in a dotted line.

The regenerative currents flowing in the direction can flow into both of a channel and a body diode of a MOSFET included in each of the synchronous rectifying circuits 10b and 10d.

Depending on the amount of the regenerative currents, the synchronous rectifying circuits 10b and 10d flow the regenerative currents to either the channels or the body diodes of the MOSFETs, whichever have a smaller conduction loss, in order to improve the power conversion efficiency of the three-phase inverter 401.

The synchronous rectifying circuits 10a, 10c, 10e, and 10f improve the power conversion efficiency of the three-phase inverter 401 in commutation observed between the other phases.

(Embodiment 4)

Described next is another embodiment of the three-phase inverter exemplified as the power conversion apparatus in accordance with the present invention.

Figure 9:
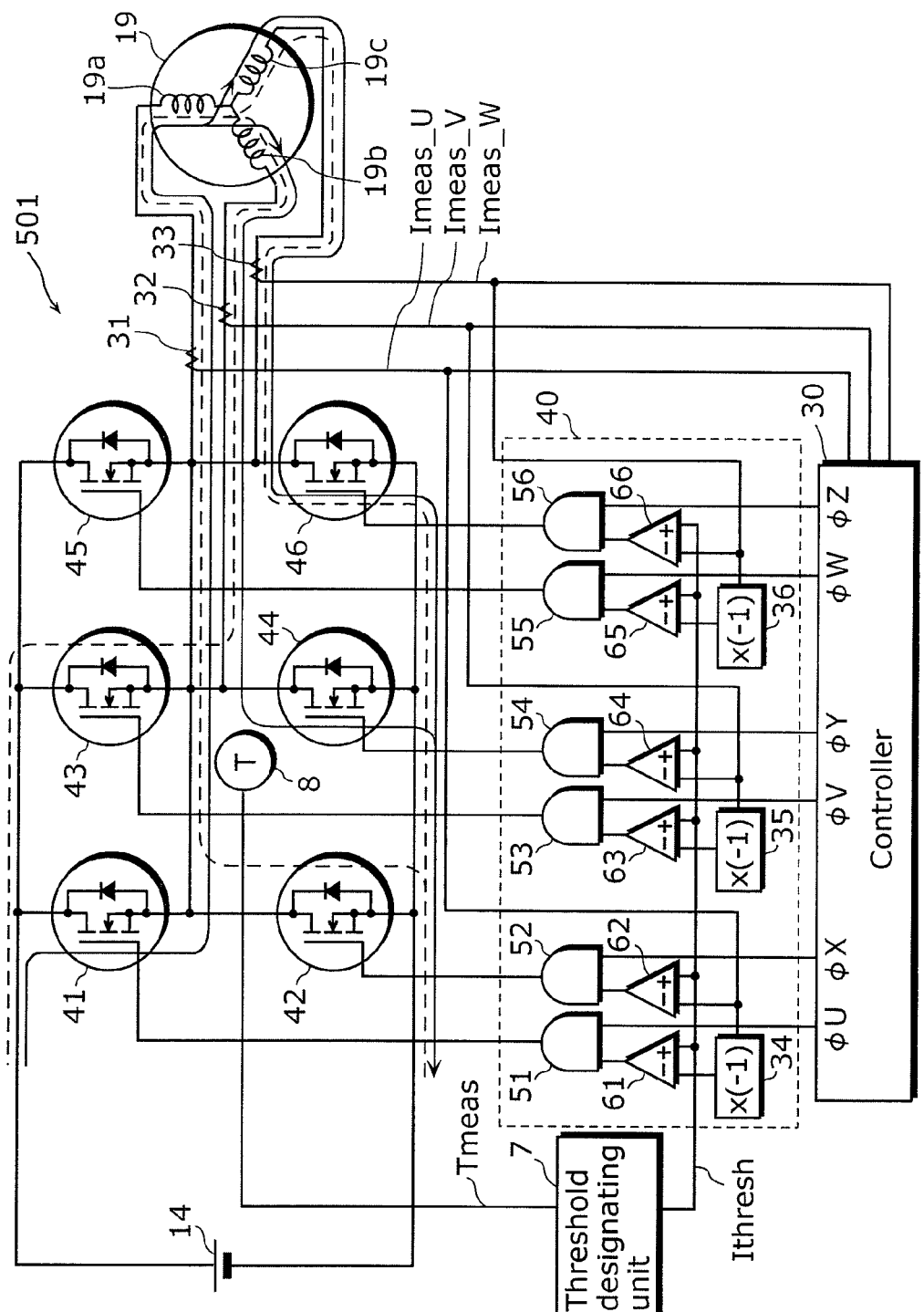
FIG. 9 is a functional block diagram exemplifying another structure of the three-phase inverter in accordance with the present invention.

FIG. 9 is a functional block diagram exemplifying a structure of a three-phase inverter 501 serving as a power conversion apparatus in accordance with Embodiment 4 of the present invention. Chiefly described below are the differences between (i) the three-phase inverter 501, and (ii) the boost converter 101 in FIG. 1 and the three-phase inverter 401 in FIG. 8B.

Comparison shows that the three-phase inverter 501 is different from the three-phase inverter 401 shown in FIG. 8B in executing prohibition control on synchronous rectification by determining a current flowing into a load for each phase. A typical three-phase converter usually includes a circuit which determines, for each phase, an amount of a current flowing into a load, in order to execute drive control of the load. Such a circuit can be employed in the three-phase inverter 501.

The three-phase inverter 501 includes a controller 30, current measuring units 31 to 33, the temperature measuring unit 8, and MOSFETs 41 to 46. They are provided in a typical three-phase inverter. The three-phase inverter 501 further includes the threshold designating unit 7 and a synchronous rectification prohibiting circuit 40. They are characteristic to the implementation of the present invention.

In the three-phase inverter 501, the MOSFETs 41 to 46 forms respective arms. The arms are serially connected in pairs. Each pair of the arms forms a leg of a corresponding one of three phases. Both ends of each of legs are connected to a direct current power source 14. The midpoint of each leg is connected to one of the corresponding coils 19a to 19c.

Each of the MOSFETs 41 to 46 includes either a diode or a body diode. Here, the MOSFETs 41 to 46 exemplify a switching element according to an implementation of the present invention. The MOSFET 12 with a body diode included exemplifies a switching unit according to an implementation of the present invention.

The current measuring units 31 to 33 measure amounts of currents "Imeas_U", "Imeas_V", and "Imeas_W", respectively, and provide signals each representing the measurement result. Here, each of "Imeas_U", "Imeas_V", and "Imeas_W" shows an amount of a current flowing through a line supplying a load current. The load current flows from the midpoint of the leg of the corresponding phase to one of the associated coils 19a, 19b, and 19c. For example, the current amount "Imeas_U" measured by the current measuring unit 31 is an amount of a current flowing into the coil 19a. The current amount "Imeas_U" represents (i) a drain current amount of the MOSFET 41 where a forward direction of the body diode is positive, and (ii) a value whose sign of a drain current amount of the MOSFET 42 is inverted.

The current measuring units 31 to 33 exemplify a load current determining unit according to an implementation of the present invention.

Based on the current amounts measured by the current measuring units 31 to 33, a torque control signal which is not shown, and a rotor position detecting signal, the controller 30 provides control signals "ϕU", "ϕX", "ϕV", "ϕY", "ϕW", and "ϕZ" to be used for making the MOSFETs 41 to 46 conductive. As widely known, these control signals have "ϕU" and "ϕX", "ϕV" and "ϕY", and "ϕW" and "ϕZ" each matched in a pair. One of the pairs of the control signal is exclusively provided. The pairs of the control signals are provided with the phase of each pair shifted by 120 degrees. Usually, these control signals are intermittently provided per period using switching control employed for obtaining desired torque. The period is much shorter than a rotational period of the rotor The temperature measuring unit 8, provided near the MOSFETs 41 to 46, measures a temperature to provide the measurement result as the temperature value "Tmeas".

The threshold designating unit 7 designates to the synchronous rectification prohibiting circuit 40 the amount of the threshold current; namely, "Ithresh". The "Ithresh" corresponds to the temperature value "Tmeas" obtained by the temperature measuring unit 8. The threshold current amount "Ithresh" represents a drain current amount indicating the boundary between the first active region and the second active region.

The synchronous rectification prohibiting circuit 40 prohibits the supply of the control signals "ϕU", "ϕX", "ϕV", "ϕY", "ϕW", and "ϕZ" to the MOSFETs 41 to 46 based on the comparison between (i) the threshold current amount "Ithresh" obtained by the threshold designating unit 7, and (ii) the current amounts "Imeas_U", "Imeas_V", and "Imeas_W" measured by the current measuring units 31 to 33. The synchronous rectification prohibiting circuit 40 includes AND gates 51 to 56, comparators 61 to 66, and calculators 34 to 36

The calculators 34 to 36 provide values, each of which sign of "Imeas_U", "Imeas_V", and "Imeas_W" is inverted, as drain current amounts of the MOSFETs 42, 44, and 46. Here, "Imeas_U", "Imeas_V", and "Imeas_W" are the current amounts measured by the current measuring units 31 to 33.

The AND gates 51 to 56 and the comparators 61 to 66 are arranged in association with the MOSFETs 41 to 46, and operate as the AND gate 5 and the comparator 6 in Embodiment 1 operate. When the MOSFETs 41 to 46 are in the first active region, the AND gates 51 to 56 and the comparators 61 to 66 provide the corresponding control signals "φU", "φX", "φV", "φY", "φW", and "φZ" as gate signals. When MOSFETs 41 to 46 are in the first active region, the AND gates 51 to 56 and the comparators 61 to 66 block the corresponding control signals "φ", "φX", "φV", "φY", "φW", and "φZ".

Following the case of Embodiment 3, a phase, referred to as a first phase, involves turning on the MOSFETs 41, 44, and 46 to intend to flow currents to the coil 19a. Here, the currents flow to the center of the three-phase motor 19 illustrated in FIG. 9. Another phase, referred to as a second phase, involves turning on the MOSFETs 42, 43, and 46 to intend to flow currents to the coil 19b. Here, the currents flow to the center of the three-phase motor 19 illustrated in FIG. 9.

Assume in FIG. 9 that currents, whose direction is shown in a solid line, flow immediately before the commutation from the first phase to the second phase. Here, immediately after the commutation, regenerative currents of the coils 19a to 19c flow in a direction shown in a dotted line.

The regenerative currents flowing in the direction can flow into both of a channel and a body diode included in each of the MOSFETs 42 and 43.

According to the amounts of the regenerative currents measured by the current measuring units 31 and 32, the synchronous rectification prohibiting circuit 40 blocks the gate signals supplied to each of the MOSFETs 42 and 43. This structure allows the regenerative currents to flow into either the channels or the body diodes, whichever have a smaller conduction loss, included in the MOSFETs 42 and 43. This improves the power conversion efficiency of the three-phase inverter 501.

The synchronous rectification prohibiting circuit 40 improves the power conversion efficiency of the three-phase inverter 501 in commutation observed between the other phases by controlling the supply and the block of the gate signals provided to the MOSFETs 41, 44, 45, and 46.

The switching between a supply and a block of the control signals "φU" and "φX", "φV" and "φY", and "φW" and "φZ" is nearly instantly executed, following the change of each of the current amounts "Imeas_U", "Imeas_V", and "Imeas_W". Thus, when the control signals "φU", "φX", "φV", "φY", "φW", and "φZ" are quickly intermissive because of the switching control, the synchronous rectification prohibiting circuit 40 can instantly switch a flow path of the regenerative currents to either a channel or a body diode, whichever has a smaller conduction loss, included in a MOSFET even in a single period of the control signal C1.

The three-phase inverter 501 allows the use of a current measuring unit typically provided in a general inverter apparatus without modification. Compared with the three-phase inverter 401 having six pairs of synchronous rectifying circuits 10 shown in FIG. 8B, the three-phase inverter 501 can be formed without increasing the number of parts.

Taking advantage of the fact that load current amounts of the three phases sum up to 0, a three-phase inverter can actually measure only the load current amounts of the two of the phases. The load current amount of the rest of one phase can be calculated out of measured values of the load current amounts of the two phases.

Figure 10:
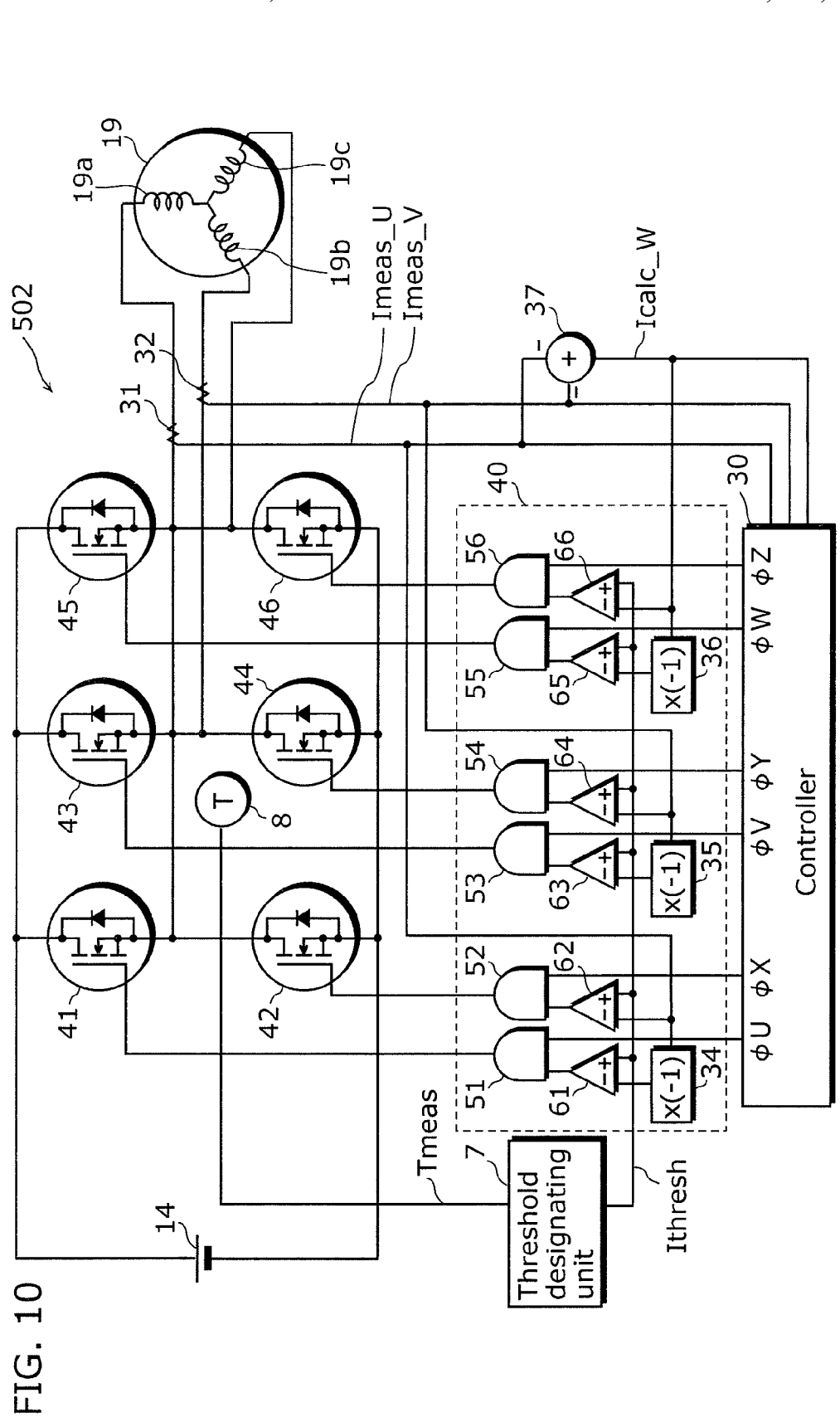
FIG. 10 is a functional block diagram exemplifying another structure of the three-phase inverter in accordance with the present invention.

FIG. 10 is a functional block diagram exemplifying a structure of a three-phase inverter 502 calculating a load current amount of one phase out of measured values of load current amounts of the other two phases.

Compared with the three-phase inverter 501 shown in FIG. 9, the three-phase inverter 502 has no current measuring unit 33 and has a calculator 37. The calculator 37 (i) calculates the sum of values each of which sign of the current amount "Imeas_U" and "Imeas_V" is inverted, and (ii) provides the calculated sum as a current amount "Icalc_W". Here, the current amounts "Imeas_U" and "Imeas_V" are measured by the current measuring units 31 and 32.

The current measuring units 31 and 32, and the calculator 37 exemplify a load current determining unit according to an implementation of the present invention.

As the current amount flowing into the coil 19c, the current amount "Icalc_W" calculated by the calculator 37 is equivalently used as the current amount "Imeas_W" used in the three-phase inverter 501.

It is noted that Embodiment 4 exemplifies a three-phase motor as a load of a three-phase inverter. Concurrently, a load of a three-phase inverter serving as the power conversion apparatus according to an implementation of the present invention shall not be limited to a three-phase motor. Instead, the load of the three-phase inverter can be formed in a three-phase system power supply.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

A power conversion apparatus according to an implementation of the present invention shall not be limited to the applications to a boost converter, a buck converter, and a three-phase converter. Instead, the power converter can be widely applied to various power conversion apparatuses including a multi-phase inverter, for example.

When the power conversion apparatus according to an implementation of the present invention is created using a SiC-MOSFET, a significantly great effect will be expected in obtaining excellent power conversion efficiency particularly in the power conversion apparatus. This is because a power conversion apparatus, including SiC-MOSFET which is stably workable under high temperature, may practically handle a large amount of a current which makes on-resistance of the MOSFET greater than on-resistance of a body diode.

In addition, Embodiments exemplify the case that a MOSFET including a body diode exemplifies a switching unit of an implementation of the present invention. Other possible switching units include, for example, (i) a switching element with a MOSFET and a free-wheeling diode connected in parallel on a single semiconductor substrate, the free-wheeling diode being intentionally (not parasitically) formed aside from the MOSFET, and (ii) a switching device having a MOSFET diode representing a discrete part, and contained in one package.

In such a switching circuit and a switching device, the present invention includes a structure to (i) designate a threshold indicating a boundary between a first active region and a second active region, the first active region which observes a larger conduction loss in flowing a current into a diode than into a MOSFET, and the second active region which, contrary to the first active region, observes a smaller conduction loss, and (ii) prohibit supplying a control signal which turns on the MOSFET in the case where a measurement amount of either a current flowing into the switching circuit and a switching device, or a voltage generated thereat is greater than the designated threshold.

Industrial Applicability

The present invention can be used in a power conversion apparatus. In particular, the present invention is suitable for use in a power conversion apparatus executing synchronous rectification, such as a converter and an inverter

The invention claimed is:

1. A power conversion apparatus which converts a direct current into an N-phase alternate current, where N is an integer equal to 3 or greater, and supplies the converted N-phase alternate current to an inductor working as a load and provided for each phase, said power conversion apparatus comprising:
   2N arms each including a switching unit having a field-effect transistor representing a switching element and a diode connected in parallel, said switching element becoming conductive according to a control signal to be supplied, such that a flow path of a regenerative current of the inductor is formed, said diode having the regenerative current of the inductor flow in a forward direction, and said field-effect transistor being placed such that the regenerative current of the inductor flows from a source toward a drain on said field-effect transistor;
   N legs each provided in a corresponding one of N-phases, formed with said 2N arms serially connected in a pair, having ends connected to a direct-current power source, and having a mid point connected to the inductor of the corresponding one of the N-phases;
   a load current determining unit configured to determine an amount of a current flowing into the inductor provided in each of the N-phases;
   a temperature measuring unit configured to measure a temperature and output a result of the measurement as a temperature value;
   a threshold designating unit configured to designate, as a threshold current and based on the temperature value output from said temperature measuring unit, a current amount at which (i) an on-resistance of said switching element obtained based on a characteristic of said switching element for a current flowing only through said switching element becomes equal to (ii) an on-resistance of said diode obtained based on a characteristic of said diode for a current flowing only through said diode, the current flowing only through said switching element and the current flowing only through said diode both flowing in the forward direction with respect to said diode and having a same value; and
   a prohibition control unit configured to prohibit supplying the control signal to said switching element included in said leg of the corresponding N-phase, when the amount of the current, for each of the N-phases, determined by said load current determining unit is greater than the threshold current designated by said threshold designating unit.

2. The power conversion apparatus according to claim 1, wherein said load current determining unit includes N current measuring units each provided to an associated one of the N-phases.

3. The power conversion apparatus according to claim 1, wherein said load current determining unit includes (i) (N-1) current measuring units each provided in a corresponding one of (N-1) phases included in the N-phases, and (ii) a calculator configured to calculate a current amount of another phase included in the N-phases.

4. A method of controlling a power conversion apparatus which converts a direct current into an N-phase alternate current, where N is an integer equal to 3 or greater, and supplies the converted N-phase alternate current to an inductor working as a load and provided for each phase,
   wherein the power conversion apparatus includes:
      2N arms each including a switching unit having a field-effect transistor representing a switching element and a diode connected in parallel, the switching element becoming conductive according to a control signal which is supplied, such that a flow path of a regenerative current of the inductor is formed, the diode having the regenerative current of the inductor flow in a forward direction, and the field-effect transistor being placed such that the regenerative current of the inductor flows from a source toward a drain on the field-effect transistor; and
      N legs each provided in a corresponding one of N-phases, formed with the 2N arms serially connected in a pair, having ends connected to a direct current power source, and having a mid point connected to the inductor of a phase, included in the N-phases, corresponding to the mid point, and
   wherein said method comprises:
      determining an amount of a current flowing into the inductor provided in each of the N-phases;
      measuring a temperature to obtain a temperature value;
      designating, as a threshold current and based on the temperature value, a current amount at which (i) an on-resistance of the switching element obtained based on a characteristic of the switching element for a current flowing only through the switching element becomes equal to (ii) an on-resistance of the diode obtained based on a characteristic of the diode for a current flowing only through the diode, the current flowing only through the switching element and the current flowing only through the diode both flowing in the forward direction with respect to the diode and having a same value; and
      prohibiting supplying the control signal to the switching element included in the leg of the corresponding N-phase, when the amount of the current, for each of the N-phases, determined in said determining is greater than the threshold current designated in said designating.

5. The power conversion apparatus according to claim 1, wherein said switching element is a MOSFET, and said diode is a body diode included in said MOSFET.

6. The method of controlling the power conversion apparatus according to claim 4, wherein the switching element is a MOSFET, and the diode is a body diode included in the MOSFET.

7. The power conversion apparatus according to claim 1, wherein said temperature measuring unit measures the temperature of said switching element.

* * * * *